July 29, 1969 J. M. COLLINGS 3,458,799
SEMI-CONDUCTOR CHOPPER CIRCUIT FOR CHOPPER STABILIZED OPERATIONAL AMPLIFIERS AND METHOD
Filed July 22, 1966
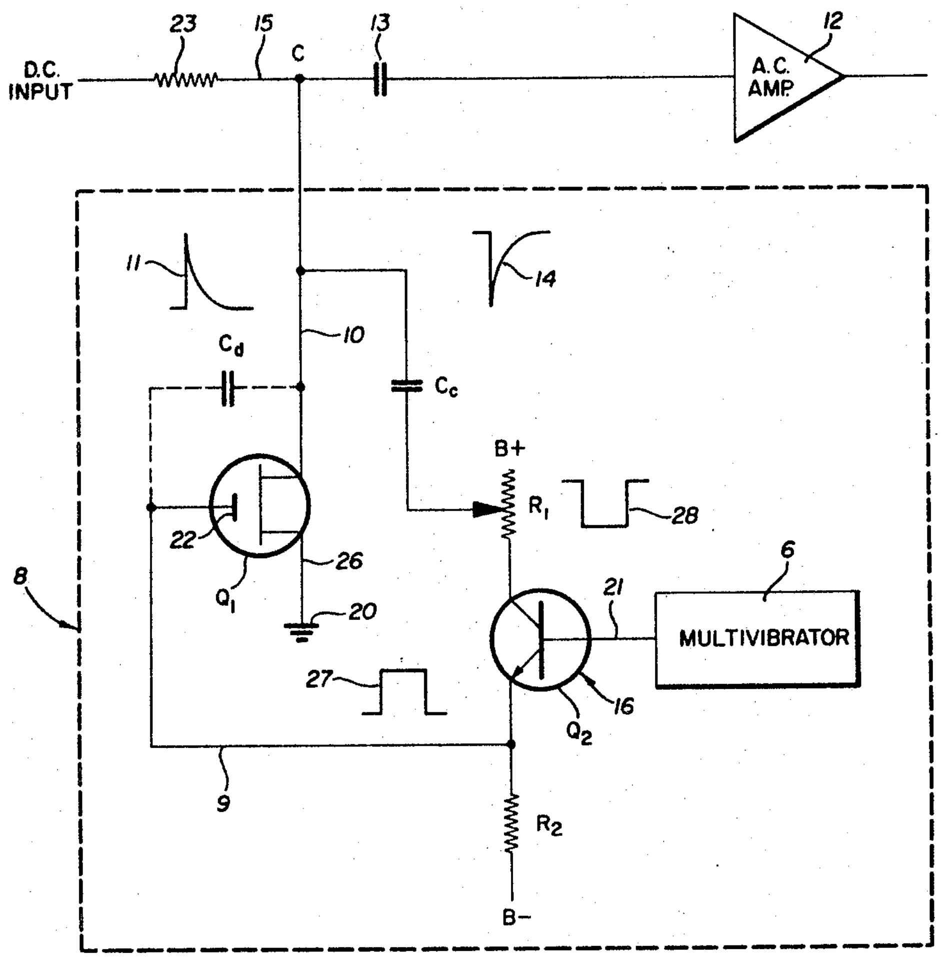
INVENTOR.
Jerry M. Collings
BY
Warren, Brosler, Cypher & Anglim Attorneys 3,458,799

SEMI-CONDUCTOR CHOPPER CIRCUIT FOR CHOPPER STABILIZED OPERATIONAL AMPLIFIERS AND METHOD

Jerry M. Collings, Concord, Calif., assignor to Zeltex, Inc., a corporation of California Filed July 22, 1966, Ser. No. 567,294
Int. Cl. H02m 7/44, 7/68; H03k 17/00
U.S. Cl. 321—44 2 Claims

ABSTRACT OF THE DISCLOSURE

In a semi-conductor chopper stabilized amplifier, undesirable signal noise from the chopper drive source is eliminated by generating at the chopper output, a signal precisely coincidental but of opposing phase with an unwanted transient signal produced by the chopper in response to its driving source. Particularly, a single output driving source is connected both to the semi-conductor chopper modulator and to a polarity inverter having its output coupled through a capacitor back to the modulating point of the amplifier, i.e., the output of the semi-conductor chopper.

In a preferred embodiment of the invention, a single transistor is utilized to provide respectively at the emitter and collector thereof dual output circuits issuing the above opposite phase coincidental wave forms in response to a common driving source.

The invention relates to chopper stabilized operational amplifiers, that is, one that utilizes an additional AC coupled amplifier (having a capacitor in the input circuit blocking the DC) and which obtains its input signal through the use of a chopper which modulates the DC input voltage and also very low frequency input voltages, say, up to about 5 cycles a second. In broader terms, therefore, the present invention relates to a modulator having an output adapted for connection to the modulating point of the input signal line of an AC amplifier.

Various types of modulators (choppers) may be used, as for example, mechanical switches and appropriate vacuum tube and semi-conductor (solid state) circuits. Mechanical choppers are inherently bulky, have a limited life, and require relatively high driving currents. Semi-conductor chopper circuits are therefore much preferred. However, all semi-conductor choppers exhibit one detrimental property, that is, capacitance to the driving source. The basic elements of a semi-conductor chopper circuit are the actual chopper or switching elements and an AC driving source such as a multivibrator. Customarily, a free running relaxation oscillator providing a square wave is used for driving (turning on and off) the semi-conductor chopper device. Ideally, the switch would have no coupling between the driving source for the switch and the modulating point of the input signal line of the AC amplifier. However, due to the inherent capacitance in the semi-conductor choppers, it is impossible to provide perfect isolation between the multivibrator driving circuit and the input line of the AC amplifier.

The internal capacitance of the semi-conductor chopper couples the high frequencies involved in the fast rise time of the square wave to the input line of the amplifier; and due to the differentiation involved a coupled rise time signal appears as a spike in the input of the amplifier, the spike having a fast almost vertical rise time and a short exponential decay. This spike has a number of detrimental effects. It causes saturation in the output stage of the amplifier. It causes the amplifier to work non-linearly. The area of the spike will be averaged by the amplifier and appear as a DC error which is highly undesirable.

Heretofore, attempts have been made to cancel the undesirable spike discussed above, but in general this has not been satisfactorily accomplished to the degree desired. Previous attempts at spike cancellation have been based upon the use of an opposite wave form available in the multivibrator. However, this available opposite wave form lacked time coincidence due to the transition delay unavoidable in a multivibrator. Accordingly, the inverse spike fed back in such an arrangement was not precisely in time or in phase with the troublesome spike and accordingly cancellation was imperfect.

In accordance with the present invention, and as a principal feature thereof, an opposite square wave form is generated exactly in time with the driving wave form for the semi-conductor chopper, and this opposite square wave form is fed to the modulator output through a capacitor selected in relation to the internal capacitance of the semi-conductor chopper and which therefore generates a second spike signal which is exactly in time and 180° out of phase with the undesirable spike signal produced by the semi-conductor chopper. The out of phase spike signal can thus be formed with the same area and therefore the same energy content as the troublesome spike signal. Accordingly, it is an object of the present invention to provide a semi-conductor chopper circuit for chopper stabilized operational amplifiers in which the undesirable spike signal discussed in the foregoing is neutralized and cancelled out and the wave form of the driving source for the chopper is isolated from and is not reflected in the input line of the amplifier.

Another object of the present invention is to provide a semi-conductor chopper circuit for chopper stabilizer operational amplifiers in which the chopper circuit and means for accomplishing spike cancellation is accomplished in an electronic circuit using all solid state devices, and thereby providing a high degree of reliability and dependable operation over an indefinitely long period of time with minimum drain or power requirements.

A further object of the present invention is to provide a semi-conductor chopper circuit of the character described which may be readily manually adjusted both initially and from time to time as may be required due to minor tolerance differences in and subsequent minor changes in value of circuit components so that spike cancellation may be readily obtained not only initially but also throughout the life of the device.

The invention possesses other objects and features of advantage, some of which of the foregoing will be set forth in the following description of the preferred form of the invention which is illustrated in the drawing accompanying and forming part of this specification. It is to be understood, however, that variations in the showing made by the said drawing and description may be adopted within the scope of the invention.

The drawing is a schematic wiring diagram of a semiconductor chopper circuit for chopper stabilized operational amplifiers constructed in accordance with the present invention.

The apparatus of the present invention comprises, briefly, a modulator 8 having an output 10 adapted for connection to the modulating point C of the input signal line 15 of an AC amplifier 12, here shown as an operational amplifier; the connection to the amplifier being made through a capacitor 13 for passing AC signals to the input of the amplifier, but blocking DC. Modulator 8 functions as a switch to periodically open and close an electrical connection from point C in the input line to a ground shown at 20. The modulator here consists of a semi-conductor chopper, preferably in the form of a Mos-Fet, designated as $Q_1$; an AC drive source 6 for the chopper; an inverter 16 in this instance provided by transistor $Q_2$ connected to the source 6; and a capacitor $C_c$ connecting the output of inverter 16 to the modulator output 10.

The driving source 6 for the Mos-Fet chopper preferably consists of a multivibrator providing a square wave output. Only one side of the multivibrator is used in the present invention, since the interpositioning of transistor $Q_2$ provides both the chopper driving voltage and as inverter 16 the compensation voltage. As here shown, multivibrator 6 is connected by conductor 21 to the base of transistor $Q_2$ providing inverter 16 between the base and collector electrode of $Q_2$. The emitter of $Q_2$ is connected by conductor 9 to the gate 22 of Mos-Fet $Q_1$. The drain and source terminals of Mos-Fet $Q_1$ are connected to the output line 10 and ground line 26, respectively. The square wave driving voltage applied to gate 22 via conductor 9 is graphically depicted at 27. The Mos-Fet chopper $Q_1$ functions in such a manner that when the gate voltage is positive or at zero volts, the element is off, that is the switch is open; and when the driving voltage is negative, at approximately minus ten volts, it is full on, that is that switch is closed. The multivibrator output voltage is controlled to provide these "on" and "off" levels.

The Mos-Fet is a metal oxide semi-conductor field effect transistor, which consists of a basic semi-conductor channel with a completely isolated metalized surface, the metal oxide layers. A voltage at this metal oxide layer will modulate the conductivity of the semi-conductor channel. This particular Mos-Fet works in the enhancement mode, that is an applied voltage will cause a setup of charges in the semi-conductor channel to enhance the conduction of this material. In the present case a basic semiconductor channel made of P material is preferred and which responds to the above-noted minus ten volts. N material in the channel may be used, in which case the response would be to a positive voltage.

A Mos-Fet is here selected as a chopper, among other reasons, because of its very low drain to gate capacity, as indicated by capacitance $C_d$ in the drawing. There is also a drain to source capacity which has essentially no influence on the performance, since it is a straight capacity to ground, and the only effect of this capacity is to infinitesimally slow down the rise time of the drive wave form. The inescapable presence of capacitance $C_d$ prevents a perface isolation between the driving source 6 and the input signal line. This capacitance, as above noted, couples to the modulator output the high frequencies involved in the rise time of the square wave drive voltage. Due to the differentiation effected by the internal capacitance $C_d$ this coupled rise time appears as a spike signal, as depicted at 11, with an almost vertical rise and a short exponential decay, depending on the impedance as seen from point C. It is this troublesome spike signal referred to in the foregoing with which the present invention is concerned.

As above noted, previous attempts have been made to cancel out spike signal 11 by using the opposite wave form which is available at multivibrator 6. However, as above noted, this opposite wave form has lacked time coincidence and cancellation has been imperfect. The preferred approach of the present invention is to use only one output of the multivibrator 6 and to feed this to transistor $Q_2$ which provides a circuit means capable of producing opposite phase coincidental wave forms, as depicted at 27 and 28, and to supply one of these wave forms to chopper $Q_1$ and the other of the wave forms to capacitor $C_c$, which will produce at output line 10 an inverted spike signal shown at 14 which is exactly equal and opposite to, and is therefore effective in cancelling, spike signal 11.

Inverter 16 here is provided by an NPN transistor $Q_2$ which additionally operates as an emitter follower driver as far as the gate drive to $Q_1$ is concerned and moreover operates as a degenerated voltage amplifier to issue the inverted compensation wave form at the collector thereof. As above noted, the signal from multivibrator 6 is conditioned to swing between zero and minus ten volts, the operational parameters for Mos-Fet $Q_1$; and since there is a zero to minus ten volt swing at the base of $Q_2$, there has to be a corresponding zero to minus ten volt swing at the emitter of $Q_2$ which is connected via line 9 to the gate of $Q_1$. The current forced through resistor $R_2$ is the emitter current of $Q_2$ and, therefore, essentially the collector current of $Q_2$. Thus, the current flow through potentiometer $R_1$ connected between the collector of $Q_2$ and capacitor $C_c$ is essentally equal to the current through resistor $R_2$. Where both resistors are equal, the voltages appearing across $R_1$ and $R_2$ will be equal but 180° out of phase. The only provision for proper operation must be that $Q_2$ will always operate in the linear mode, that is $Q_2$ must not saturate. As an important feature of the present construction, minor differences in tolerances of the components, principally capacitances of $C_d$ and $C_c$, may be readily, manually compensated for initially and from time to time thereafter, as required, by adjustment of the value of $R_1$, thereby always providing equal, out of phase, and cancelling spike signals at the modulator output. Since the current flowing through $R_1$ and $R_2$ flows at the same time, substantially perfect time coincidence of the cancelling spike wave forms is obtained.

A further advantage of using a Mos-Fet for the chopper which operates in the enhancement mode is that there cannot be any leakage from gate 22 of $Q_1$ to point C, since the voltage across these two points when $Q_1$ is open or off is zero. As above noted, the conditioned wave form from the multivibrator is set at zero to minus ten volts, so that gate 22 in the chopper open condition is maintained at zero volts. When $Q_1$ is off, gate 22 at zero volts, point C in a chopper stabilized operational amplifier is always close to zero volts. In the foregoing condition, point C is most susceptible to leakage. When $Q_1$ is open, the impedance from point C to ground is very high. Therefore, any leakage current would flow through the input resistor 23 back to the junction (not shown) of the operational amplifier and thereby cause annoying error currents. Due to the nature of the Mos-Fet, the inherent leakage resistance from drain to gate, or from point C to gate 22, is very high, in the order of $10^{12}$ ohms., thus permitting essentially zero error current. The foregoing characteristic is only obtainable in a Mos-Fet transistor. This characteristic applies to both the P channel and the N channel Mos-Fet, except that in the latter instance the driving voltage polarities are reversed. Thus, the use of a Mos-Fet in conjunction with an inverter for perfect spike energy cancellation at the modulating point of a stabilized operational amplifier is an important feature of the present invention.

I claim:

1. A modulator having an output adapted for connection to the modulating point of the input signal line of an AC amplifier and comprising, an MOS field effect transistor chopper having an output connected to said modulator output, a square wave multivibrator driving source, a transistor having a base input circuit connected to said source and an emitter output circuit and a collector output circuit and being biased for linear signal operation between said input and output circuits, and a capacitive impedance component connected between one of said output circuits and said modulator output and the other said output circuit being connected to and for driving said chopper.

2. The combination of claim 1 wherein said dual output circuits each include a resistance and the resistance in the circuit connected to said capacitor being variable for equalizing and cancelling the out of phase spike signals appearing at said modulator output.

References Cited

UNITED STATES PATENTS

| | | | |
|---|---|---|---|
| 3,229,190 | 1/1966 | Morrison et al. | 321—45 |
| 3,238,383 | 3/1966 | Falk | 321—8 XR |
| 3,281,718 | 10/1966 | Weberg | 332—31 |

FOREIGN PATENTS

| | | |
|---|---|---|
| 1,016,975 | 1/1966 | Great Britain. |

JOHN F. COUCH, Primary Examiner

W. M. SHOOP, JR., Assistant Examiner

U.S. Cl. X.R.

307—240, 251; 330—9